(12) United States Patent
Bhattacharya et al.

(10) Patent No.: US 8,537,548 B2
(45) Date of Patent: Sep. 17, 2013

(54) METHOD, APPARATUS AND COMPUTER SYSTEM FOR VORTEX GENERATOR ENHANCED COOLING

(75) Inventors: Anandaroop Bhattacharya, Bangalor (IN); Rajiv K. Mongia, Fremont, CA (US); Krishnakumar Varadarajan, Bangalor (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/021,681

(22) Filed: Jan. 29, 2008

(65) Prior Publication Data

US 2009/0190302 A1    Jul. 30, 2009

(51) Int. Cl.
*H05K 7/20*    (2006.01)

(52) U.S. Cl.
USPC .......... 361/694; 361/703; 361/710; 416/96 R; 417/410.2

(58) Field of Classification Search
USPC ...... 361/679, 46, 679.48, 692, 697, 688–690, 361/694–695, 679.46, 679.51, 679.54, 701, 361/703–704, 707–710, 679.49
See application file for complete search history.

(56) References Cited

U.S. PATENT DOCUMENTS

| | | | | |
|---|---|---|---|---|
| 5,063,476 A * | 11/1991 | Hamadah et al. | | 361/697 |
| 5,121,290 A * | 6/1992 | Azar | | 361/692 |
| 5,285,350 A * | 2/1994 | Villaume | | 361/690 |
| 5,763,950 A * | 6/1998 | Fujisaki et al. | | 257/712 |
| 6,371,200 B1 * | 4/2002 | Eaton | | 165/80.3 |
| 6,588,497 B1 * | 7/2003 | Glezer et al. | | 165/84 |
| 6,628,522 B2 * | 9/2003 | Trautman et al. | | 361/704 |
| 6,765,796 B2 * | 7/2004 | Hoffman et al. | | 361/695 |
| 7,044,212 B1 | 5/2006 | Hofmann | | |
| 7,275,393 B2 | 10/2007 | Jung et al. | | |
| 7,450,381 B2 * | 11/2008 | Gilliland et al. | | 361/695 |
| 7,961,462 B2 * | 6/2011 | Hernon | | 361/694 |
| 7,983,045 B2 | 7/2011 | Bhattacharya et al. | | |
| 2005/0011635 A1 | 1/2005 | Liu et al. | | |
| 2006/0042291 A1 * | 3/2006 | Petroski | | 62/264 |
| 2007/0119573 A1 * | 5/2007 | Mahalingam et al. | | 165/80.4 |
| 2008/0041574 A1 | 2/2008 | Arik et al. | | |
| 2008/0062644 A1 * | 3/2008 | Petroski | | 361/695 |
| 2008/0137291 A1 * | 6/2008 | Mongia et al. | | 361/690 |
| 2009/0190302 A1 | 7/2009 | Bhattacharya et al. | | |

OTHER PUBLICATIONS

Non-Final Office Action Mailed Jan. 27, 2010, U.S. Appl. No. 12/163,422, 11 pages.
Final Office Action Received for U.S. Appl. No. 12/163,422, mailed on Jul. 26, 2010, 11 pages.

(Continued)

*Primary Examiner* — Courtney Smith
(74) *Attorney, Agent, or Firm* — Kacvinsky Daisak PLLC

(57) ABSTRACT

Some embodiments of a method, apparatus and computer system are described for vortex generator enhanced cooling. The computer system may include a housing and an apparatus. The apparatus may include one or more vortex generators coupled to a heat spreader and positioned in close proximity to an electronic component, and a flow of air to provide for an exchange of thermal energy, where the flow of air is provided by a configuration of the housing, and where the one or more vortex generators may promote turbulence to enhance the exchange of thermal energy of the electronic component. In some embodiments, an air mover may be used to increase the flow of air in the housing. Other embodiments are described.

25 Claims, 6 Drawing Sheets

(56) References Cited

OTHER PUBLICATIONS

Liou et al., "Heat transfer and fluid flow in a square duct With 12 Different Shaped Vortex Generators", Journal of Heat Transfer, vol. 122, May 2000, pp. 327-335.

Dupont et al., Experimental Study of the Flow in a Compact Heat Exchanger Channel With Embossed-Type Vortex Generators, Journal of Fluids Engineering, vol. 125, Jul. 2003, pp. 701-709.

Fiebig et al., "Heat Transfer Enhancement and Drag by Longitudinal Vortex Generators in Channel Flow", Experimental Thermal and Fluid Science, 1991, pp. 103-114.

Nalawade et al.,"Heat Transfer Performance with an Array of Delta Wing Vortex Generators on Two Opposite Walls in a Square Duct", Proceedings of 18th National and 7th ISHMT-ASME Heat and Mass Transfer Conference, pp. 192-198 (2006).

* cited by examiner

METHOD, APPARATUS AND COMPUTER SYSTEM FOR VORTEX GENERATOR ENHANCED COOLING

BACKGROUND

1. Technical Field

Some embodiments of the invention generally relate to cooling systems. More specifically, some embodiments relate to an apparatus, computer system and method for enhancing the transfer of heat.

2. Discussion

In recent years, electronic components and systems have been made to operate at faster speeds. These and other developments, such as processors with one or more cores provide better performance, decrease the size and weight of components, and increase the density of components. Generally, these factors increase the heat generated by electronic components and the systems in which they reside. This is particularly true in mobile or small form factor computing environments, where these factors can lead to overheating, which can negatively affect performance, as well as significantly reduce battery life.

The above-mentioned factors increase the need for effective cooling of electronic components. FIG. 1 illustrates a conventional configuration of a cooling apparatus in a computer system 100. The computer system 100 includes a housing 101, a central processing unit (CPU) 102, and one or more electronic components 104, such as 104a and 104b. The CPU 102 is typically in contact with a heat spreader 106 which is in close proximity to a fan 108. The fan 108 forces air out of the computer system 100 by passing through the heat spreader 106. The fan 108 thus serves to establish a direction for air flow, shown at 110, within which external air comes into the system at one or more of the air intakes 112.

As previously mentioned, increases in operating temperatures may negatively affect the performance of the computer system. Therefore, there is a need for an enhanced cooling system for computer systems. In particular, there is a need for cooling systems that are more efficient at transferring heat from electronic components and computer systems.

BRIEF DESCRIPTION OF THE DRAWINGS

Various advantages of embodiments of the present invention will become apparent to one of ordinary skill in the art by reading the following specification and appended claims, and by referencing the following drawings, in which:

DETAILED DESCRIPTION

Reference is made to some embodiments of the invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Moreover, in the following detailed description of the invention, numerous specific details are set forth in order to provide a thorough understanding of the invention. However, the invention may be practiced without these specific details. In other instances, well-known methods, procedures, components and circuits have not been described in detail as not to unnecessarily obscure aspects of the invention.

Indeed, reference in the specification to an embodiment or some embodiments of the invention means that a particular feature, structure or characteristic described in connection with the embodiment is included in at least one embodiment of the invention. Thus, the appearances of the phrase "in one embodiment" or "according to an embodiment" appearing in various places throughout the specification generally are not referring to the same embodiment.

Figure 1:
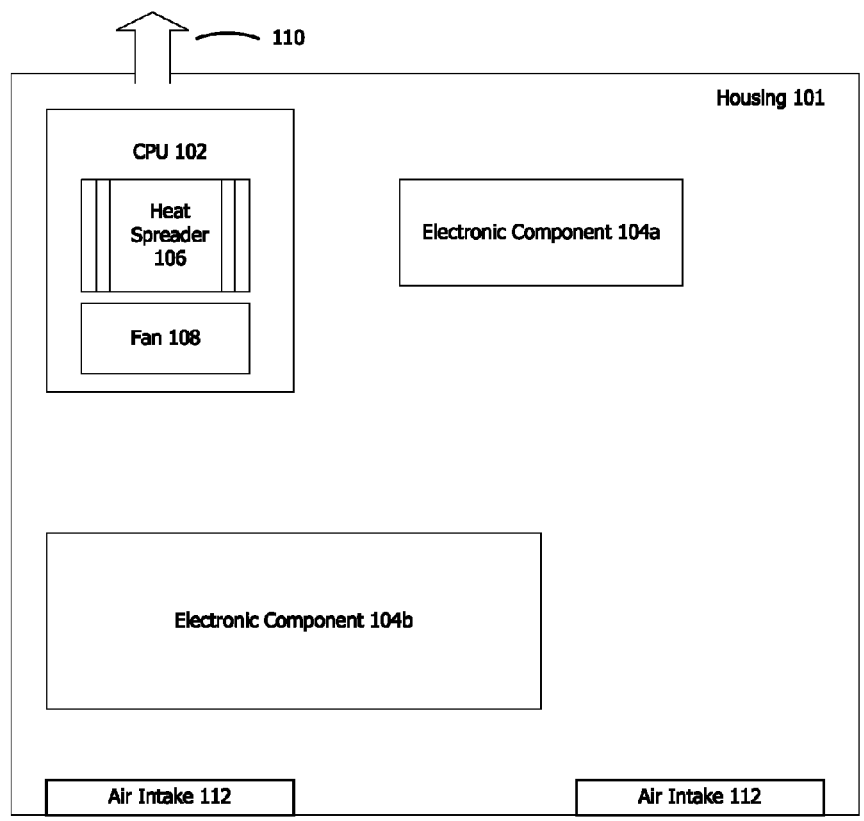
FIG. 1 illustrates a example of conventional cooling in a computer system.
Figure 2:
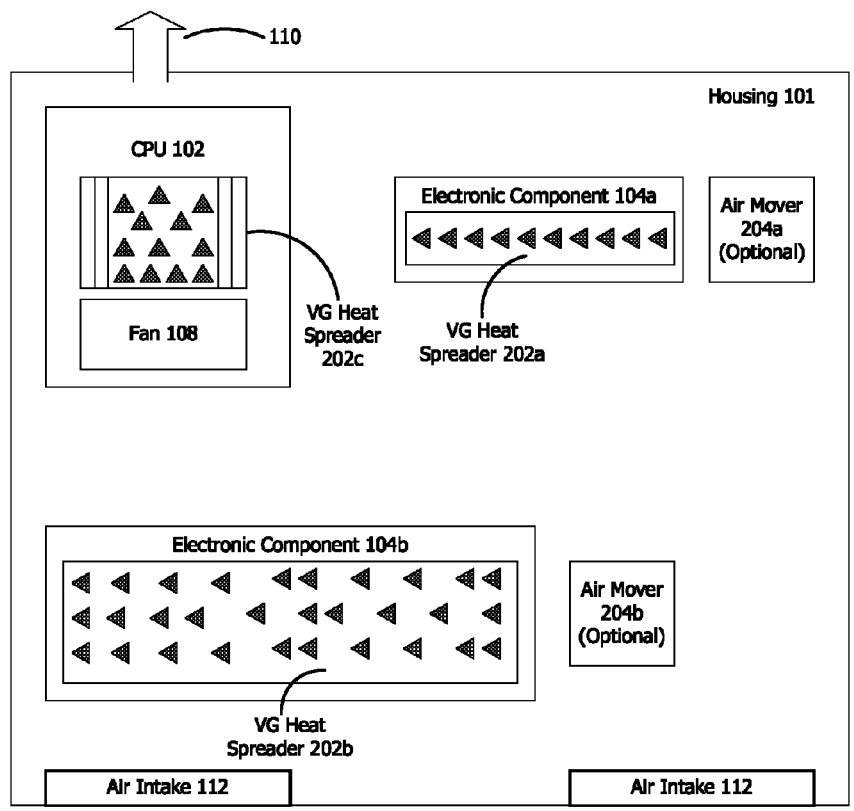
FIG. 2 illustrates an example of one or more enhanced cooling apparatuses according to some embodiments of the invention.

FIG. 2 illustrates an example of one or more enhanced cooling apparatuses in a cooling system according to some embodiments of the invention. According to some embodiments of the invention, a computer system 200 may include a housing 101, a central processing unit (CPU) 102, and one or more electronic components 104, shown as 104a and 104b. The CPU 102 may be in contact with a vortex generator enabled heat spreaders (VGHS) 202c which may further include a fan 108. The fan 108 may promote a flow of air out of the computer system 200. The fan 108 may serve to establish a direction for air flow, shown at 110, within which external air comes into the system at air intake 112.

In some embodiments, the transfer of heat may be enhanced by the addition of one or more VHGS 202, shown as 202a, 202b, and 202c. For example, according to some embodiments, the VGHS 202a may generate, in the locality of the electronic component 104a, an increase in the turbulence of the air near the electronic component 104a. In some embodiments, the vortex generators (VGes or generators) of the VGHS 202 may have delta wing shapes for local enhancement of heat transfer. In some embodiments, the generators may have a different shape, such as that of a post, fence, sawtooth, or other shape as is described elsewhere herein.

The vortex generators may promote turbulence via the formation of small eddies that are shed in the wake of the flow as it passes them. As one of ordinary skill in the relevant art would appreciate, turbulence may include random vertical motions in the flow of air with either or both spatial or temporal irregularities. This turbulence may enhance the local dissipation of heat or thermal energy, as one of ordinary skill in the relevant art would appreciate based at least on the teachings provided herein. In some embodiments, the vortex generators may be placed near power dissipating components, such as those described herein or other localized hot spots in or on the computer system. In some embodiments, the computer system 200 may use less or nearly the same power with the VGHS placed within the system. Furthermore, the computer system 200 may include different air intakes 112 when enabled with the VGHS than without, as one of ordinary skill in the relevant art would appreciate the air flow requirements based at least on the teachings provided herein.

As such, in some embodiments of the invention, the VGHS 202a may provide a zone of turbulent air. The increase in air turbulence may remove a larger amount of heat from the electronic component 104a and into the air flow. In some embodiments, the air flow may be improved by an air mover 204a. In some embodiments, as described elsewhere herein with respect to the VGHS 204c, the fan 108 may be used. In alternative embodiments, the VGHS 202a may be positioned to enhance an air flow in a different direction, such as toward the housing 101 and/or away from any other components of the computer system 200. In some embodiments, the VGHS 202 may not increase the velocity of air, but rather alter the shape or volume of the velocity air and/or thermal boundary layer in order to increase the heat dissipation from the electronic component(s) 104 and/or CPU 102.

According to some embodiments of the invention, an apparatus for the enhancement of heat transfer may include the VGHS 202. The VGHS may be internally coupled to an electronic device and positioned with respect to an electronic component, according to some embodiments. Furthermore, in some embodiments, the electronic component 104 may include a heat spreader, heat sink, or heat exchanger, as is described elsewhere herein. Furthermore, the VGHS 202 may not have a separate heat spreader, or the heat spreader of the VGHS may be integrated into the electronic component 104 or CPU 102, as one of ordinary skill in the relevant art would appreciate based at least on the teachings described herein. In some embodiments, the VGHS, according to some embodiments, may only include the vortex generators arranged on the surface of the electronic component. In such embodiments, the electronic component may be constructed in a manner to support the placement and/or arrangement of the vortex generators on its surface.

In some embodiments, the VGHS 202 may be integrated into a heat spreader, such as, but not limited to, heat spreader 106, and may be constructed from the same material or from the same material. In addition, according to some embodiments, the VGHS 202 may be coupled to an electronic component, such as, but not limited to, electronic components 104.

Furthermore, in some embodiments of the invention, the electronic component may be one of a central processing unit (CPU), a processor, a memory, a hard drive, a network card, a video graphics card, a motherboard, a display, or a heat source. In some embodiments, the computer system may be an electronic device such as a mobile computer, a desktop computer, a server computer, or a handheld computer as one of ordinary skill in the relevant art would appreciate based at least on the teachings described herein.

In addition, with respect to FIG. 2, in some embodiments, the VGHS 202, such as VGHS 202b, may be used in combination with or integrated with an air mover 204, as shown with air movers 204a and 204b or fan 108. Various designs of air movers are well-known in the art and one of ordinary skill in the relevant art(s) would appreciate, based at least on the teachings described herein, how to use and position at least one of a coaxial fan, an axial fan, a piezoelectric fan, a membrane fan or other type of air mover to promote the flow of air over the VGHS.

Similarly to VGHS 202a, the VGHS 202b may provide, in the locality of the electronic component 104b, an increase in the turbulence of the air over the electronic component 104b. The increase in air turbulence may remove a larger amount of heat from the electronic component 104b and into the air flow. In alternative embodiments, the VGHS 202b may be positioned to enhance an air flow in a different direction, such as away from any other components of the computer system 200.

In some embodiments, a VGHS 202c may be positioned with respect to the CPU 102. In some embodiments, the CPU 102 may include a microprocessor, a multiple core processor, or the like. The position of the VGHS 202c may be in close proximity to the CPU 102, according to some embodiments of the invention. The VGHS 202c may enhance the heat transfer from the CPU 102 to the air flow 110, which exits the computer system 200 due, at least in part, to the operation of fan 108.

In some embodiments of the invention, as one of ordinary skill in the relevant art would appreciate, based at least on the teachings described herein, that the embodiments of the invention may not require more than one VGHS. Furthermore, that one of ordinary skill would appreciate that the heat spreader portion of the VGHS 202 and fan 108 may be replaced with alternative primary cooling systems that are able to make use of the vortex generators and/or VGHS. Indeed, the embodiments of the VGHS may be readily implemented in various cooling systems where an enhancement of air or fluid flow, such as, but not limited to liquid flow, through the system may transfer heat from electronic components as is described elsewhere herein.

Figure 3:
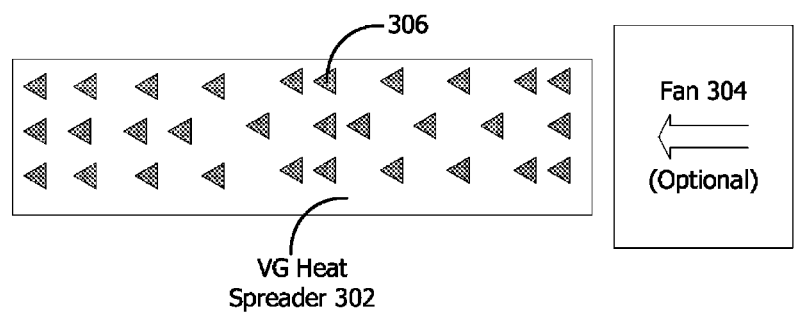
FIG. 3 illustrates an example of a vortex generator apparatus according to some embodiments of the invention.

FIG. 3 illustrates an example of a vortex generator heat spreader (VGHS) apparatus 300, according to some embodiments of the invention. The apparatus 300 may include a VGHS 302 with one or more vortex generators 306. In some embodiments, the generators may have a triangular or delta-winged shape, as shown in, at least, FIG. 3. In some embodiments, the generators may have alternate shapes, as is described in further detail elsewhere herein.

Moreover, in some embodiments, the generators may be placed in various patterns, such as, but not limited to, generally straight rows or columns, generally diagonally placed, generally circular or random placements, or a combination of placements. Furthermore, in some embodiments, the generators may be of generally the same or different sizes, shapes, or configurations. As is described in further detail elsewhere herein, the configurations, shapes and sizes of the generators may be altered to provide different affects on the flow passing near it, as one of ordinary skill in the relevant art would appreciate based at least on the teachings provided herein.

The apparatus 300 may optionally include an air mover or fan 304, which in some embodiments of the invention may include a blower-type fan, coaxial fan, axial fan, a piezoelectric fan, a membrane fan, or other type of air mover as one of ordinary skill in the relevant art would appreciate based at least on the teachings provided herein. In some embodiments of the invention, the air mover 302 may be coupled, either directly or indirectly, to a power source by power connection (not shown). The power source may be from the computer system or one of its components, as one of ordinary skill in the relevant art would appreciate based at least on the teachings described herein.

Figure 4:
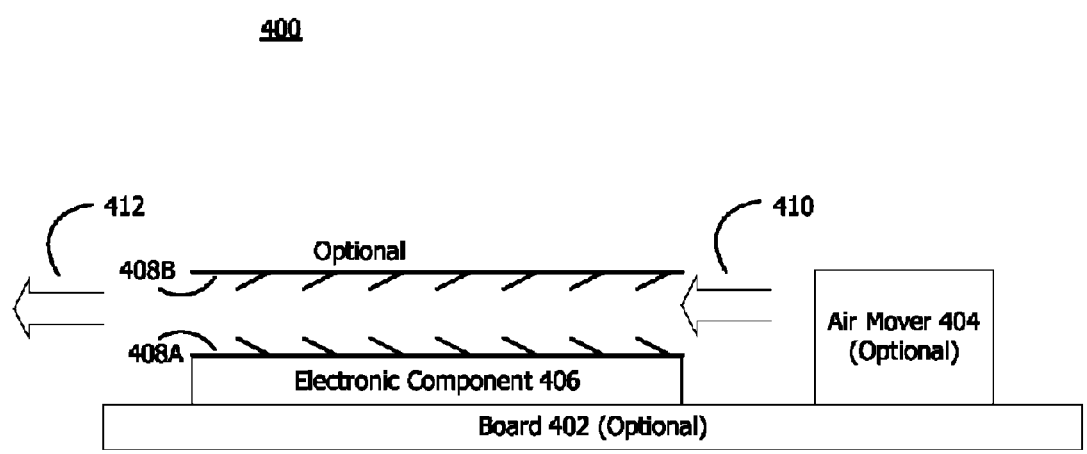
FIG. 4 illustrates an example of a vortex generator apparatus according to some embodiments of the invention.

FIG. 4 illustrates an example of a vortex generator apparatus 400 according to some embodiments of the invention. The apparatus 400 may include a VGHS 408, such as, but not limited to VGHS 408A and/or VGHS 408B, which may be positioned in proximity with the heat spreader or the electronic component to produce an increase in the turbulence of an air flow 410 over an electronic component 406, according to some embodiments of the invention. The flow of air 410 may result in a turbulent flow of air 412, as shown, where, the flow of air 412 may include dissipated heat or thermal energy from the electronic component 406. Furthermore, the component 406 and/or air mover 404 may be optionally coupled to a board 402, such as, but not limited to, a motherboard or part of the housing of the system.

As shown in the embodiments of at least FIGS. 3 and 4, the use of one or more vortex generators, such as, but not limited to VG 306, may enhance, in some cases significantly enhance, the local heat transfer coefficient(s) of the apparatus and/or system. One of ordinary skill in the relevant art would appreciate that the enhancement may depend on other factors of the apparatus or system, such as, but not limited to, the Reynolds number of the flow and the VG configurations, some of which are described below. For example, in some embodiments, the computer system 200 may make use of larger or more air intakes 112 rather than one or more air movers 204 or fan 108, as the extra intake of air may provide enough flow for the VGes and/or VGHSes to provide for an increase in the localized heat transfer at the same or similar flow rate by creating turbulence. As a result, in some embodiments, the use of one or more VGes and/or VGHSes instead of one or more air movers may provide for reduced power usage and/or requirements for the system, such as computer system 200.

Figure 5:
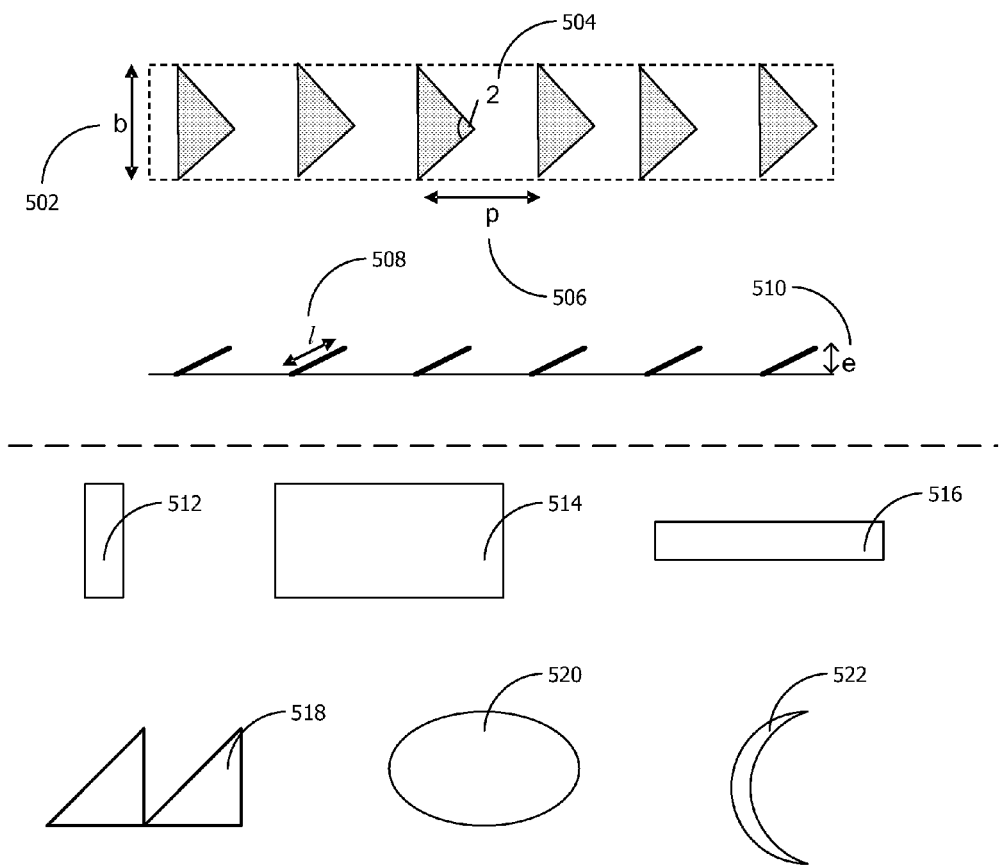
FIG. 5 illustrates examples of vortex generator types according to some embodiments of the invention.

FIG. 5 illustrates embodiments 500 and 512-522 of vortex generators according to some embodiments of the invention. In some embodiments, the generators may be shaped in triangular or delta-wing shapes, as shown in 500. In embodiment 500, a schematic of a row of delta winged vortex generators is shown. Some of the parameters of the generators are noted, such as its height (e) 510, length (L or l) 508, and pitch (p) 506. Moreover, other notable parameters for the configuration of the generators include hydraulic diameter ($D_h$) of the system in which the apparatus or generators are placed, the generator width (b) 502, and angle of the delta shape (2α) 504.

As one of ordinary skill in the relevant art would appreciate, based at least on the teachings provided herein, the performance of the generators may be changed by altering one or more of the parameters described herein. Moreover, in some embodiments, the parameters may be combined to form expressions and/or ratios that are similarly known to one of ordinary skill in the relevant art. For example, a Reynolds number or range of numbers, which is a dimensionless parameter used in fluid mechanics and associated fields to represent a ratio of inertia forces to viscous forces, may be determined, in part, from the flow's velocity and viscosity, and the length 508. As such, one of ordinary skill in the relevant art would appreciate that altering these parameters, as well as obtaining measurements of at least the Reynolds number for a system or apparatus, may provide for increase in the turbulence of the flow and an enhancement in heat transfer from the electronic component.

Moreover, in some embodiments, the generators may also be shaped as posts 512, fences 514, or slats 516, as well as sawtooths 518 (also known as dogtooths), circular or elliptical generators 520, or crescents 522. The generators, in some embodiments, independent of their shape, may also have thick trailing edges, drooped leading edges, or leading-edge notches, which may produce similar effects as the shapes of the generators. As one of ordinary skill in the relevant art(s) would appreciate based at least on the teachings provided herein, each shape or configuration may have different advantages or drawbacks, such as, but not limited to, increased drag.

Figure 6:
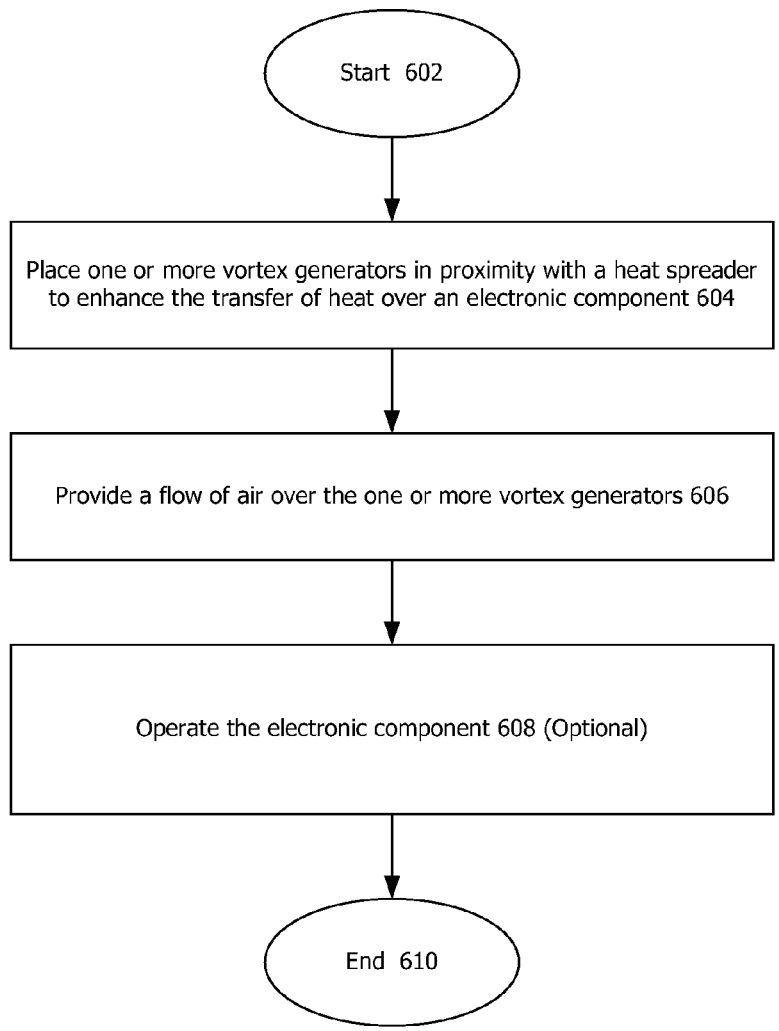
FIG. 6 illustrates a flowchart for vortex generator enhanced cooling according to some embodiments of the invention.

FIG. 6 illustrates a flowchart for vortex generator enhanced cooling according to some embodiments of the invention. According to some embodiments, the process may begin at 602 and proceed to 604, where it may place one or more vortex generators in proximity with a heat spreader to enhance the transfer of heat over an electronic component. In some embodiments, the one or more vortex generators may be shaped as delta wings, posts, fences, slats, sawtooths, ellipses, or crescents. Moreover, in some embodiments, the heat spreader may be integrated into the electronic component, such that the one or more vortex generators may be placed directly on the electronic component.

The process may then proceed to 606, where it may provide a flow of air over the one or more vortex generators. In some embodiments, each vortex generator may promote turbulence in the flow of air. The process then may proceed to 608, where it may operates the electronic component. In some embodiments of the invention, the operation may be in conjunction or combination with the operation of an electronic device or computer system.

The process 600 may then proceed to 610, where it terminates and may be repeated as one of ordinary skill in the relevant art would appreciate, based at least on the teachings provided herein. According to some embodiments, one or more of 604, 606, and/or 608 may occur independently.

Embodiments of the invention may be described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. Those skilled in the art can appreciate from the foregoing description that the techniques of the embodiments of the invention can be implemented in a variety of forms.

Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. An apparatus comprising:
one or more fixed triangular shaped vortex generators with a base arranged on a surface of an electronic component and an opposing tip angled away from the electronic component to create a triangular ramp surface, the one or more fixed triangular shaped vortex generators arranged to define an open space between the one or more fixed triangular shaped vortex generators and the surface of the electronic component on which the one or more fixed triangular shaped vortex generators are mounted; and
an air mover operative to provide a flow of air over the triangular ramp surface of the one or more fixed vortex generators, the one or more fixed vortex generators arranged to promote turbulence in the flow of air via the formation of small eddies that are shed in a wake of the flow of air as it passes over the fixed vortex generators to enhance the exchange of thermal energy of the electronic component.

2. The apparatus of claim 1, wherein the air mover includes a coaxial fan, an axial fan, a piezoelectric fan, or a membrane fan.

3. The apparatus of claim 1, comprising one or more air intakes.

4. The apparatus of claim 3, wherein at least one of the one or more vortex generators is shaped substantially as delta wings, posts, fences, slats, sawtooths, ellipses, or crescents.

5. The apparatus of claim 1, wherein the one or more vortex generators are integrated with a heat spreader.

6. The apparatus of claim 1, wherein the one or more vortex generators are integrated with the electronic component.

7. The apparatus of claim 1, wherein the electronic component includes a memory, a hard drive, a network card, a video graphics card, a motherboard, a display, or a heat source.

8. The apparatus of claim 1, wherein the apparatus comprises a mobile computer, a desktop computer, a server computer, or a handheld computer.

9. A computer system comprising:
- a housing;
- one or more fixed triangular shaped vortex generators with a base arranged on a surface of an electronic component and an opposing tip angled away from the electronic component to create a triangular ramp surface, the one or more fixed triangular shaped vortex generators arranged to define an open space between the one or more fixed triangular shaped vortex generators and the surface of the electronic component on which the one or more fixed triangular shaped vortex generators are mounted; and
- an air mover operative to provide a flow of air over the triangular ramp surface of the one or more fixed vortex generators, the one or more fixed vortex generators arranged to promote turbulence in the flow of air via the formation of small eddies that are shed in a wake of the flow of air as it passes over the fixed vortex generators to enhance the exchange of thermal energy of the electronic component.

10. The computer system of claim 9, wherein the air mover includes a coaxial fan, an axial fan, a piezoelectric fan, or a membrane fan.

11. The computer system of claim 9, wherein the housing includes one or more air intakes.

12. The computer system of claim 11, wherein at least one of the one or more vortex generators is shaped substantially as delta wings, posts, fences, slats, sawtooths, ellipses, or crescents.

13. The computer system of claim 9, wherein the one or more vortex generators are integrated with a heat spreader.

14. The computer system of claim 9, wherein the one or more vortex generators are integrated with the electronic component.

15. The computer system of claim 9, wherein the electronic component includes a memory, a hard drive, a network card, a video graphics card, a motherboard, a display, or a heat source.

16. The computer system of claim 9, wherein the housing is configured as a mobile computer, a desktop computer, a server computer, or a handheld computer.

17. The computer system of claim 9, wherein the one or more vortex generators is integrated into the housing.

18. A method comprising:
- arranging one or more fixed triangular shaped vortex generators in proximity with an electronic component with a base of the vortex generators arranged on a surface of the electronic component and an opposing tip angled away from the electronic component to create a triangular ramp surface, the one or more fixed triangular shaped vortex generators arranged to define an open space between the one or more fixed triangular shaped vortex generators and the surface of the electronic device on which the one or more fixed triangular shaped vortex generators are mounted; and
- arranging an air mover in proximity to the vortex generators and the electronic component, the air mover operative to provide a flow of air over the triangular ramp surface of the one or more fixed vortex generators, the one or more fixed vortex generators arranged to promote turbulence in the flow of air via the formation of small eddies that are shed in a wake of the flow of air as it passes over the fixed vortex generators to enhance the transfer of heat.

19. The method of claim 18, further comprising:
operating the electronic component.

20. The method of claim 18, wherein the air mover includes a coaxial fan, an axial fan, a piezoelectric fan, or a membrane fan.

21. The method of claim 18, wherein the electronic component includes a central processing unit, a processor, a memory, a hard drive, a network card, a video graphics card, a motherboard, a display, or a heat source.

22. The method of claim 18, wherein at least one of the one or more vortex generators is shaped substantially as a delta wings, posts, fences, slats, sawtooths, ellipses, or crescents.

23. The apparatus of claim 1, the one or more fixed triangular shaped vortex generators arranged on an interior side of a housing of the apparatus arranged to support the electronic component.

24. The computer system of claim 9, the one or more fixed triangular shaped vortex generators arranged on an interior side of the housing.

25. The method of claim 18, comprising:
Arranging the one or more fixed triangular shaped vortex generators arranged on an interior side of a housing arranged to support the electronic component.

* * * * *

UNITED STATES PATENT AND TRADEMARK OFFICE
CERTIFICATE OF CORRECTION

PATENT NO. : 8,537,548 B2
APPLICATION NO. : 12/021681
DATED : September 17, 2013
INVENTOR(S) : Anandaroop Bhattacharya et al.

Page 1 of 1

It is certified that error appears in the above-identified patent and that said Letters Patent is hereby corrected as shown below:

On the Title page, in item (75), in column 1, in "Inventors", line 1, delete "Bangalor" and insert -- Bangalore --, therefor.

On the Title page, in item (75), in column 1, in "Inventors", line 4, delete "Bangalor" and insert -- Bangalore --, therefor.

Signed and Sealed this
Tenth Day of December, 2013

Margaret A. Focarino
*Commissioner for Patents of the United States Patent and Trademark Office*